US009449990B2

(12) United States Patent
Miki et al.

(10) Patent No.: US 9,449,990 B2
(45) Date of Patent: Sep. 20, 2016

(54) THIN FILM TRANSISTOR AND DISPLAY DEVICE

(71) Applicants: KOBE STEEL, LTD., Kobe-shi (JP); Samsung Display Co., Ltd., Yongin (KR)

(72) Inventors: Aya Miki, Kobe (JP); Shinya Morita, Kobe (JP); Hiroshi Goto, Kobe (JP); Hiroaki Tao, Kobe (JP); Toshihiro Kugimiya, Kobe (JP); Byung Du Ahn, Hwaseong (KR); Gun Hee Kim, Asan (KR); Jin Hyun Park, Yongin (KR); Yeon Hong Kim, Hwaseong (KR)

(73) Assignees: KOBE STEEL, LTD., Kobe-shi (JP); Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/423,838

(22) PCT Filed: Aug. 30, 2013

(86) PCT No.: PCT/JP2013/073373
§ 371 (c)(1),
(2) Date: Feb. 25, 2015

(87) PCT Pub. No.: WO2014/034874
PCT Pub. Date: Mar. 6, 2014

(65) Prior Publication Data
US 2015/0228674 A1 Aug. 13, 2015

(30) Foreign Application Priority Data

Aug. 31, 2012 (JP) .................. 2012-192666
Apr. 26, 2013 (JP) .................. 2013-094087

(51) Int. Cl.
*H01L 27/12* (2006.01)
*H01L 29/786* (2006.01)
(Continued)

(52) U.S. Cl.
CPC ......... *H01L 27/1225* (2013.01); *H01L 29/408* (2013.01); *H01L 29/51* (2013.01);
(Continued)

(58) Field of Classification Search
CPC .................................................. H01L 27/1225
See application file for complete search history.

(56) References Cited

U.S. PATENT DOCUMENTS

2010/0155717 A1    6/2010  Yano et al.
2010/0244029 A1*   9/2010  Yamazaki ........... H01L 27/1225
                                                                   257/52
(Continued)

FOREIGN PATENT DOCUMENTS

CN    102610618 A    7/2012
JP    2011-108873 A  6/2011
(Continued)

OTHER PUBLICATIONS

International Search Report issued Oct. 8, 2013 in PCT/JP2013/073373 (with English language translation).
(Continued)

*Primary Examiner* — Benjamin Sandvik
(74) *Attorney, Agent, or Firm* — Oblon, McClelland, Maier & Neustadt, L.L.P.

(57) ABSTRACT

Provided is a thin film transistor which is provided with an oxide semiconductor thin film layer and has a threshold voltage that does not change much due to light, a bias stress or the like, thereby exhibiting excellent stress stability. A thin film transistor of the present invention is provided with a gate electrode, an oxide semiconductor layer composed of a single layer which is used as a channel layer, an etch stopper layer to protect a surface of the oxide semiconductor layer, a source-drain electrode, and a gate insulator layer arranged between the gate electrode and the channel layer. The metal elements constituting the oxide semiconductor layer comprise In, Zn and Sn. The hydrogen concentration in the gate insulator layer in direct contact with the oxide semiconductor layer is controlled to 4 atomic % or lower.

6 Claims, 1 Drawing Sheet

(51) Int. Cl.
  *H01L 29/51*  (2006.01)
  *H01L 29/40*  (2006.01)
  *H01L 21/02*  (2006.01)

(52) U.S. Cl.
  CPC ..... *H01L29/7869* (2013.01); *H01L 29/78606* (2013.01); *H01L 21/0217* (2013.01); *H01L 21/02126* (2013.01); *H01L 21/02164* (2013.01); *H01L 21/02274* (2013.01)

(56) References Cited

U.S. PATENT DOCUMENTS

| | | |
|---|---|---|
| 2011/0147736 A1 | 6/2011 | Miyanaga et al. |
| 2011/0260121 A1 | 10/2011 | Yano et al. |
| 2011/0284854 A1 | 11/2011 | Endo et al. |
| 2012/0001168 A1 | 1/2012 | Ichijo et al. |
| 2012/0032730 A1* | 2/2012 | Koyama ............... G11C 8/04 327/530 |
| 2012/0056176 A1 | 3/2012 | Yamazaki |
| 2012/0181533 A1 | 7/2012 | Yoo et al. |
| 2012/0223301 A1* | 9/2012 | Ueda ............... H01L 29/78606 257/43 |
| 2013/0048978 A1* | 2/2013 | Watanabe ........... H01L 29/7869 257/43 |
| 2013/0112971 A1 | 5/2013 | Yano et al. |
| 2013/0221351 A1 | 8/2013 | Ebata et al. |
| 2013/0248855 A1 | 9/2013 | Miki et al. |
| 2015/0014684 A1 | 1/2015 | Miyanaga et al. |
| 2015/0053975 A1 | 2/2015 | Endo et al. |

FOREIGN PATENT DOCUMENTS

| | | |
|---|---|---|
| JP | 2011-146692 A | 7/2011 |
| JP | 2012-9845 A | 1/2012 |
| JP | 2012-33913 A | 2/2012 |
| JP | 2012-151443 A | 8/2012 |
| JP | 2012-164963 A | 8/2012 |
| TW | 201208079 A1 | 2/2012 |
| TW | 201232787 A1 | 8/2012 |
| WO | 2010/067571 A1 | 6/2010 |

OTHER PUBLICATIONS

International Preliminary Report on Patentability and Written Opinion issued Mar. 3, 2015 in PCT/JP2013/073373 (with English language translation).

"Amorphous Oxide Semiconductors" Solid Physics, vol. 44, No. 9, 2009, pp. 621-633 (corresponds to "Amorphous Oxide Semiconductors for High-Performance Flexible Thin-Film Transistors").

Kenji Nomura, et al., "Amorphous Oxide Semiconductors for High-Performance Flexible Thin-Film Transistors" Japanese Journal of Applied Physics, vol. 45, No. 5B, 2006, pp. 4303-4308.

Kenji Nomura, et al., "Room-temperature fabrication of transparent flexible thin-film transistors using amorphous oxide semiconductors" Nature, vol. 432, Nov. 25, 2004, pp. 488-492.

* cited by examiner

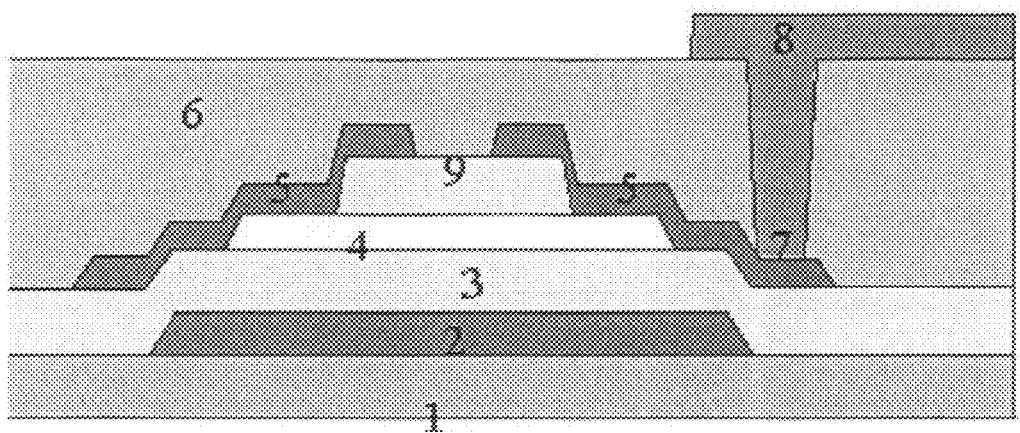

THIN FILM TRANSISTOR AND DISPLAY DEVICE

TECHNICAL FIELD

The present invention relates to a thin-film transistor (TFT) to be used in display devices such as a liquid crystal display, an organic EL display and the like, and a display device including the thin film transistor.

BACKGROUND ART

As compared with widely used amorphous silicon (a-Si), an amorphous (noncrystalline) oxide semiconductor has high carrier mobility (which may be referred to as electron field-effect mobility, hereinafter may be often referred to as simply "mobility"), a high optical band gap, and film formability at low temperature and, therefore, has been highly expected to be applied for next generation displays which are required to have a large size, high resolution, and high-speed drive, resin substrates which have low heat resistance, and the like (Patent-Document 1 and the like).

Of oxide semiconductors, an amorphous oxide semiconductor containing indium, gallium, zinc, and oxygen (In—Ga—Zn—O, hereinafter also referred to as "IGZO"), which has a considerably high carrier mobility, is particularly preferably used. For example, Non-Patent Documents 1 and 2 disclose a thin film transistor (TFT) including a thin oxide semiconductor film of In:Ga:Zn=1.1:1.1:0.9 (atomic % ratio) as a semiconductor layer (active layer).

In the case where an oxide semiconductor is used as a semiconductor layer for a thin film transistor, the oxide semiconductor is required not only to have a high carrier concentration (mobility) but also to be excellent in switching properties (transistor characteristics, TFT characteristics) of TFT. Specifically, the oxide semiconductor is required to satisfy (1) high ON-current (maximum drain current when positive voltage is applied to a gate electrode and a drain electrode); (2) low OFF-current (drain current when negative voltage is applied to a gate electrode and positive voltage is applied to a drain electrode); (3) low SS value (Subthreshold Swing, gate voltage required to increase drain current by one digit); (4) stability of threshold voltage with the lapse of time (voltage at which drain current starts flowing when positive voltage is applied to a drain electrode and either positive or negative voltage is applied to a gate voltage); (5) a high mobility, and the like.

Furthermore, a TFT using an oxide semiconductor layer such as IGZO and the like is required to be excellent in resistance to stress (stress stability) of voltage application, light irradiation, and the like. For example, when voltage is continuously applied to a gate electrode or when a gate electrode is continuously irradiated with light in a blue emitting band in which light absorption starts in a semiconductor layer, charge is trapped in the interface of the semiconductor layer with a gate insulator layer of the thin film transistor, and the threshold voltage is considerably changed (shifted) to a negative side due to a change of charge inside the thin film transistor, and it is pointed out that because of that, the switching properties of the TFT are changed. The change of the switching properties due to the stress caused by light irradiation or voltage application leads to lowering of reliability in a display device itself.

Furthermore, similarly in an organic EL display, the semiconductor layer is irradiated with light leaked out from a light emitting layer, and the problem in which a value such as a threshold voltage varies may cause.

As described above, the shift of threshold voltage particularly leads to lowering of reliability in a display device itself such as a liquid crystal display or an organic EL display equipped with a TFT, and, therefore, it has been extremely desired to improve the stress stability (small change before and after stress test).

For example, Patent Document 2 proposes a technology of improving the electric characteristics of a TFT. Patent Document 2 discloses a technology in which the hydrogen concentration of an insulator layer (including a gate insulator layer) in contact with an oxide semiconductor layer forming a channel region is reduced to less than $6\times10^{20}$ atoms/cm$^3$ to suppress diffusion of hydrogen into the oxide semiconductor layer. If hydrogen is diffused into the oxide semiconductor layer, the excessive carriers are generated in the oxide semiconductor layer. Thus, the threshold voltage shifts in the negative direction, and drain current flows even in the state (Vg=0V) where voltage is not applied to the gate electrode (normally-on), and therefore the electric characteristics of the transistor may be degraded. Under such circumstances, it is described in Patent Document 2 that the diffusion of hydrogen into the oxide semiconductor layer is suppressed by allowing the insulator layer in contact with the oxide semiconductor layer to be an oxide insulator layer having a reduced hydrogen concentration, and oxygen is supplied to defects of the oxide semiconductor layer from the insulator layer, thereby improving the electric characteristics of the transistor. In Patent Document 2, it is described that in order to exhibit such an effect, it is necessary that the hydrogen concentration in the insulator layer be reduced to less than $6\times10^{20}$ atoms/cm$^3$. Moreover, it is also described that when such an insulator layer having a reduced hydrogen concentration is formed by a plasma CVD method, a gas in which hydrogen is not contained in its molecular structure is needed to be selected and used as the deposition gas (that is, not $SiH_4$ usually used but $SiF_4$ is used). However, the above Patent Document 2 pays no attention to an improvement in stress stability (particularly, a decrease in change of the threshold voltage against light and a bias stress).

PRIOR ART DOCUMENT

Patent Document

Patent Document 1: JP-A-2011-108873
Patent Document 2: JP-A-2012-9845

Non-Patent Document

Non-patent Document 1: Solid Physics, VOL. 44, P621 (2009)
Non-patent Document 2: Nature, VOL. 432, P488 (2004)

DISCLOSURE OF THE INVENTION

Problems to be Solved by the Invention

The present invention has been made in view of the above situation. It is an object of the present invention to provide a thin film transistor including an oxide semiconductor layer thin film, wherein the thin film transistor has a small change of the threshold voltage against light and bias stress and the like, and excellent stress stability, and to provide a display device including the thin film transistor.

Means for Solving the Problems

A thin film transistor of the present invention which can be solved above problems is a thin film transistor comprising a gate electrode, an oxide semiconductor layer composed of a single layer which is used as a channel layer, an etch stopper layer to protect a surface of the oxide semiconductor layer, a source-drain electrode, and a gate insulator layer arranged between the gate electrode and the channel layer, wherein metal elements constituting the oxide semiconductor layer comprise In, Zn and Sn, and wherein a hydrogen concentration in the gate insulator layer in direct contact with the oxide semiconductor layer is controlled to 4 atomic % or lower.

In a preferred embodiment of present invention, the above gate insulator layer is composed of a single layer structure or a laminated structure having two or more layers, and wherein when the gate insulator layer is composed of the laminated structure, a hydrogen concentration in a layer in direct contact with the oxide semiconductor layer is controlled to 4 atomic % or lower.

In a preferred embodiment of present invention, when contents (atomic %) of the respective metal elements with respect to all of metal elements excluding oxygen contained in the above oxide semiconductor layer are defined as [In], [Zn] and [Sn], respectively, a relationship of $$15 \leq [In] \leq 35, 50 \leq [Zn] \leq 60 \text{ and } 15 \leq [Sn] \leq 30$$

is satisfied.

A present invention includes a display device comprising the thin film transistor according to any above.

Effects of the Invention

According to the present invention, a thin film transistor having excellent switching properties and excellent stress stability (specifically, not only a small threshold voltage shift between before and after application of negative bias but also a small threshold voltage shift between before and after light irradiation and application of negative bias) can be provided because the hydrogen concentration in the gate insulator layer in direct contact with the oxide semiconductor layer is reduced to an appropriate range. Using the thin film transistor according to the present invention, a display device having a high reliability can be obtained.

BRIEF DESCRIPTION OF THE DRAWINGS

FIG. 1 is a schematic cross-sectional view for illustrating a thin film transistor of the present invention.

MODE FOR CARRYING OUT THE INVENTION

The present inventors have extensively studied in order to provide a thin film transistor having excellent stress stability (a small threshold voltage shift between before and after application of negative bias and between before and after light irradiation+application of negative bias) when using an oxide semiconductor layer composed of given metal elements as an active layer of the TFT. As a result, the present inventors have found that the predetermined object is achieved by reducing the hydrogen concentration in a gate insulator layer in direct contact with the oxide semiconductor layer to an appropriate range. Furthermore, the present inventors have found that in order to obtain such a gate insulator layer, the conditions (for example, temperature, film formation power density, and flow ratio of $SiH_4$ with respect to $N_2O$ as a deposition gas) at the time of forming at least the gate insulator layer in direct contact with the oxide semiconductor layer by a plasma CVD method may be appropriately controlled. The present invention has been made based on this finding.

That is, a thin film transistor of the present invention includes a gate electrode, an oxide semiconductor layer composed of a single layer which is used as a channel layer, an etch stopper layer to protect a surface of the oxide semiconductor layer, a source-drain electrode (which may be referred to as an "S/D electrode"), and a gate insulator layer arranged between the gate electrode and the channel layer. The thin film transistor is characterized in that metal elements constituting the oxide semiconductor layer comprise In, Zn and Sn, and the hydrogen concentration in the gate insulator layer in direct contact with the oxide semiconductor layer is controlled to 4 atomic % or lower.

In this specification, [In], [Zn] and [Sn] mean the respective contents (atomic %) of In, Zn and Sn with respect to all of metal elements (In, Zn and Sn) excluding oxygen (O).

In this specification, "excellent stress stability" means that when the stress test (a) in which negative bias is applied to the gate electrode (NBTS), and the stress test (b) in which negative bias is continuously applied to the gate electrode while irradiating a sample with while light (LNBTS) are carried out for 2 hours, respectively, by the method described in Examples below, the following requirements are satisfied:

(a) the shift quantity ΔVth (absolute value) between the threshold voltages (Vth) before and after the stress test of less than 5.0 V in the NBTS, and (b) the shift quantity ΔVth (absolute value) between the threshold voltages (Vth) before and after the stress test of less than 5.0 V, SS value of less than 0.55 V/decade, and the change quantity ΔIon (absolute value) between before and after the stress test of less than 10% in the LNBTS.

These measurement methods will be described in Examples below.

Note that a technology intended to improve the electric characteristics by reducing the hydrogen concentration in the gate insulator is also disclosed in the above-mentioned Patent Document 2, but it differs from the present invention in the following points.

First, the problems to be solved by the present invention is to provide a thin film transistor having a small threshold voltage change quantity between before and after stress test and excellent stress stability, whereas in Patent Document 2, no statement is made on improvement of stress stability while there is a statement about threshold voltage. According to the result of the investigations by the present inventors, it has been found that the reduction of the hydrogen content in the gate insulator layer improves the negative bias stress stability (NBTS). Furthermore, it has been found that the reduction of the hydrogen content in the gate insulator layer also improves the negative bias+light irradiation stress stability (LNBTS) in which light irradiation is added to the above NBTS. These findings are not described in Patent Document 2.

Moreover, both technologies strictly differs also in the range of the hydrogen concentration in the gate insulator layer. This is caused by the difference between both methods for film formation to obtain the gate insulator layer (the details will be described later). That is, in Patent Document 2 as described above, as a deposition gas in film formation of a gate insulator layer, $SiH_4$ that is usually used is not used and $SiF_4$ that is not usually used is selected and used, whereby the hydrogen concentration in the gate insulator layer is significantly reduced to less than $6 \times 10^{20}$ atoms/cm³ (=less than 0.667 atomic %). In contrast to this, the present invention is based on using SiH$_4$ that is usually used in film formation of a gate insulator layer, and the hydrogen concentration in the gate insulator layer is reduced to 4 atomic % or lower by appropriately controlling a gas flow ratio, temperature, film formation power density, and the like. If the hydrogen content excessively reduces as in Patent Document 2, the temperature at the time of film formation may be too high, the power input may be too high, and the film formation rate may be extremely slow, and hence a tact time of TFT production may be unsuitably increased. Therefore, from the viewpoint of a practical use, it is desirable that the lower limit (0.667 atomic % or higher) of the hydrogen concentration in the gate insulator layer of the present invention be over the upper limit of Patent Document 2 (less than 0.667 atomic %).

Hereinafter, by referring to FIG. 1, a thin film transistor (TFT) of the present invention and a preferred production method thereof will be described. FIG. 1 is a schematic cross-sectional view for illustrating one preferred embodiments of the TFT of the present invention, and it is not intended that the present invention be limited thereto. For example, although FIG. 1 shows a bottom gate type TFT, the TFT is not limited thereto, and the TFT may be a top gate type TFT having a gate insulator layer and a gate electrode on an oxide semiconductor layer in this order from a substrate side.

As shown in FIG. 1, in the TFT of this embodiment, a gate electrode 2 and a gate insulator layer 3 are successively formed on a substrate 1, and an oxide semiconductor layer 4 is formed on the gate insulator layer 3. A source-drain electrode 5 is formed on the oxide semiconductor layer 4, a passivation layer (insulator layer) 6 is formed thereon, and a transparent conductive film 8 is electrically connected to the drain electrode 5 through a contact hole 7. Furthermore, an etch stopper layer 9 to protect the surface of the oxide semiconductor layer 4 is formed on the oxide semiconductor layer 4.

First, a substrate is prepared. The substrate 1 used in the present invention is not particularly limited as long as it is commonly used in the field of display devices. Examples thereof include non-alkaline glass, soda lime glass and the like. Among these, non-alkali glass is preferable.

Next, the gate electrode 2 is formed on the substrate 1. The kinds of the gate electrode 2 are not also particularly limited and ones widely used in the technical field of the present invention can be used. Specifically, metals such as Al and Cu with low electric resistance, high melting point metals such as Mo, Cr, Ti and the like with high heat resistance, and their alloys can be preferably used. A method for forming the gate electrode 2 is also not particularly limited and methods commonly used can be adopted.

Next, the gate insulator layer 3 is formed. The gate insulator layer 3 is arranged between the gate electrode 2 and the oxide semiconductor layer 4 used as a channel layer. In the present invention, the hydrogen concentration in the gate insulator layer 3 in direct contact with the above oxide semiconductor layer is controlled to 4 atomic % or lower. According to the experiment results of the present inventors, it has been found that by controlling the hydrogen content in the gate insulator layer 3 contacting the interface with the oxide semiconductor layer 4, the resistance to bias stress and light+negative bias stress is significantly improved (see Examples described below).

Note that the gate insulator layer 3 can be composed of a single layer or a laminated layer of two or more layers. Although the number of layers of the laminated structure is not particularly limited, three or less layers are generally preferred considering the productivity, processability and the like.

When the gate insulator layer 3 has a laminated structure, the hydrogen concentration of a layer in direct contact with the oxide semiconductor layer 4 may be controlled to 4 atomic % or lower, and the hydrogen concentration of a layer not being in direct contact with the oxide semiconductor layer 4 is not particularly limited.

From the viewpoint of improving stress stability, a lower hydrogen concentration in the gate insulator layer 3 is good, preferably 3.5 atomic % or lower, more preferably 3 atomic % or lower. The lower limit of the hydrogen concentration in the gate insulating film 3 is not particularly limited from the viewpoint of the above-mentioned properties. However, considering a method of forming the gate insulating film 3 described below, it is preferred to be over the upper limit (less than 0.667 atomic %) of Patent Document 2 (that is, 0.667 atomic % or higher is preferred).

In the present invention, the hydrogen concentration in the gate insulator layer can be reduced to a predetermined range by properly controlling the film formation conditions in a plasma CVD method.

Specifically, first, the temperature at the time of film formation is preferably controlled to about 250° C. or higher. As demonstrated in Examples described below, if the temperature at the time of film formation is lower than 250° C., the hydrogen concentration cannot be sufficiently reduced, and hence the stress stability decreases. The reason therefor is inferred that lowering of the film formation temperature leads to a decreased density of a layer formed and increased Si—H bonds in a SiO$_2$ film. The film formation temperature is more preferably 270° C. or higher, further more preferably 300° C. or higher. Considering the upper temperature or the like of an apparatus used, the upper limit is controlled to about 450° C. or lower.

Furthermore, the power density at the time of film formation is preferably controlled to about 0.6 W/cm$^2$ or higher. As demonstrated in Examples described below, if the power density at the time of film formation be lower than about 0.6 W/cm$^2$, the hydrogen concentration cannot be sufficiently reduced, and hence the stress stability decreases. The reason therefor is inferred that if the film formation power density is too low, a film density decreases and Si—H bonds may be incorporated in the film. The film formation power density is more preferably 0.66 W/cm$^2$ or higher, further more preferably 0.7 W/cm$^2$ or higher.

It is preferred to reduce SiH$_4$ in a gas at the time of film formation as much as possible with respect to N$_2$O. That is, it is preferred to allow a flow ratio (volume ratio) represented by SiH$_4$/N$_2$O to be a certain value or lower. When this flow ratio is high, a decrease in film density of the SiO$_2$ film is observed and it is considered to contain many Si—H bonds.

The film formation conditions other than the above conditions are not particularly limited, and the conditions commonly used can be adopted.

For example, the gas pressure is preferably controlled in the range of about 50 to 300 Pa as gas pressure enough to stabilize discharge.

The gate insulator layer 3 formed by the above method is mainly a silicon oxide film (SiO$_2$), and may additionally contain Si—N bonds in an amount range that the hydrogen content in the film does not increase.

For example, a silicon oxide film (SiOx), the representative example of which is SiO$_2$, is a compact film and has an excellent insulating property, but has a defect that the film forming speed is slow. Then, by stacking an SiNx film having a relatively fast film forming speed and an SiOx film to constitute the gate insulator layer 3, it is possible to be intend to simultaneously obtain both satisfactory insulating property and satisfactory productivity. In this case, to ensure the satisfactory insulating property, a thickness of the SiNx film is preferably 50 times or less with respect to a thickness of the SiOx film, more preferably 25 times or less.

Next, an oxide semiconductor layer 4 is formed on the gate insulator layer 3. This oxide semiconductor layer 4 is usually sandwiched between the gate insulator layer 3 and a source-drain electrode (S/D electrode) 5. In the present invention, metal elements in the oxide semiconductor layer 4 include In, Zn and Sn (oxide semiconductor layer=IZTO).

The functions of the above metal elements are outlined below.

First, In has a function to increase carriers and enhance the mobility. However, if the amount of In is large, carriers may excessively increase and this leads to becoming conductive, and additionally, the stability against stress may decrease.

Sn has a function to increase chemical resistance such as a wet etching property and the like of the oxide semiconductor layer. However, if the amount of Sn is large, the etching processability may decrease.

Zn is supposed to contribute to the stabilization of an amorphous structure, and Zn also contributes to the improvement of the stability against stress. However, if the amount of Zn is large, the oxide semiconductor thin film may crystallize or residue may occur in etching.

The oxide semiconductor layer 4 is composed of a single layer.

It is preferred that a preferred metal ratio of the respective metal atoms constituting the oxide semiconductor layer 4 [contents (atomic %) of the respective metal elements with respect to all of the metal elements excluding oxygen] be appropriately and suitably controlled so as to obtain the excellent TFT characteristics.

Specifically, the metal ratio in the oxide semiconductor layer 4 (IZTO) preferably satisfies the following relationships when the contents (atomic %) of the respective metal elements with respect to all of the metal elements excluding oxygen are defined as [In], [Zn] and [Sn], respectively, thereby making it possible to effectively exhibit a preferred function of each of the elements as described above.

$15 \leq [In] \leq 35$ (more preferably, $15 \leq [In] \leq 25$)

$50 \leq [Zn] \leq 60$ $15 \leq [Sn] \leq 30$

A preferred film thickness of the oxide semiconductor layer 4 is about 10 nm or more and 200 nm or less.

The oxide semiconductor layer 4 is preferable to be formed into a film by a DC sputtering method or an RF sputtering method using a sputtering target having the same composition as that of the thin film. Alternatively, the film formation may be carried out by a co-sputtering method using a plurality of types of sputtering targets.

After wet etching of the oxide semiconductor layer 4, patterning is carried out. Heat treatment (pre-annealing) may be carried out, for example, in the conditions of the temperature of 250 to 350° C. (preferably 300 to 350° C.) and the time of 15 to 120 minutes (preferably 60 to 120 minutes) for improving the film quality of the oxide semiconductor layer 4 immediately after the patterning. Accordingly, the ON-current and electron field-effect mobility, which are transistor characteristics, are increased and the transistor performance is improved.

Next, an etch stopper layer 9 is formed to protect the surface of the oxide semiconductor layer 4. The oxide semiconductor layer 4 is damaged by etching when the source-drain electrode (S/D electrode) 5 is subjected to wet etching, and hence, the etch stopper layer 9 is formed in order to prevent a decrease in transistor characteristics due to defects generated on the surface of the oxide semiconductor layer 4. The kind of the etch stopper layer 9 is not particularly limited, and as examples thereof, an insulator layer of $SiO_2$ and the like can be given. The etch stopper layer 9 is formed and subjected to patterning by a plasma CVD method or the like so as to protect a channel surface.

Next, patterning for forming an electrode is performed by photolithography and dry etching in order to make a contact of the oxide semiconductor layer 4 with a source-drain electrode 5 to be formed next.

Next, the source-drain electrode 5 is formed. The kind of the source-drain electrode 5 used in the present invention is not particularly limited and ones widely used can be used. For example, similarly to the gate electrode, metals such as Al, Mo and Cu and their alloys may be used, or pure Mo may be used as described in Examples below.

As for a method for forming the source-drain electrode 5, for example, after a metal thin film is formed by a magnetron sputtering method, the resulting metal thin film is subjected to patterning by photolithography and then to wet etching, whereby the electrode can be formed.

As for the other methods for forming the source-drain electrode 5, a method in which the electrode is formed by a lift-off method after a metal thin film is formed by a magnetron sputtering method can be given. According to this method, it is also possible to process the electrode without carrying out wet etching.

Next, the passivation layer (insulator layer) 6 is formed on the oxide semiconductor layer 4. The passivation layer 6 can be formed, for example, by a CVD method. Since the surface of the oxide semiconductor layer 4 is converted easily to be conductive by plasma-induced damage due to the CVD (it is supposedly attributed to that oxygen deficiency formed on the surface of the oxide semiconductor becomes an electron donor), $N_2O$ plasma irradiation may be carried out before film formation of the passivation layer 6. The condition described in the following document is adopted as the $N_2O$ plasma irradiation condition.

J. Park, et. al, Appl. Phys. Lett., 93, 053505 (2008).

Next, after a contact hole 7 in the passivation layer 6 is formed by photolithography and dry etching, the transparent conductive film 8 is formed. The kind of the transparent conductive film 8 is not particularly limited, and those which are used commonly such as ITO and the like can be used.

The present invention also encompasses a display device having the above TFT. As examples of the display device, a liquid crystal display, an organic EL display and the like can be given.

This application claims the benefits of priority to Japanese Patent Application No. 2012-192666 filed on Aug. 31, 2012 and priority to Japanese Patent Application No. 2013-094087 filed on Apr. 26, 2013. The entire content of the specification of Japanese Patent Application No. 2012-192666 filed on Aug. 31, 2012 and that of the specification of Japanese Patent Application No. 2013-094087 filed on Apr. 26, 2013 are incorporated herein by reference.

EXAMPLES

Below, by way of examples, the present invention will be more specifically described. However, the present invention is not limited by the following examples. It is naturally understood that modifications may be properly made and practiced within the scope adaptable to the meaning described above and below. All of these are included in the technical scope of the present invention.

Example 1

A TFT shown in FIG. 1 was produced as mentioned below and the stress stability and the like were evaluated. In this example, a transparent conductive film 8 was not formed.

First, a Mo thin film with a thickness of 100 nm as a gate electrode 2 and a $SiO_2$ film with a thickness of 250 nm as a gate insulator layer 3 were successively formed on a glass substrate 1 ("EAGLE 2000" manufactured by Corning Incorporated, diameter 100 mm×thickness 0.7 mm).

The gate electrode 2 was formed by using a pure Mo sputtering target by a DC sputtering method. The sputtering conditions are as follows: film formation temperature: room temperature, film formation power density: 3.8 W/cm², carrier gas: Ar, gas pressure at the time of film formation: 2 mTorr, and Ar gas flow rate: 20 sccm.

The gate insulator layer 3 was formed by using a mixed gas of $SiH_4$ and $N_2O$ as a carrier gas by a plasma CVD method. Specifically, in this example, a circular electrode with a diameter of 8 inch (an area of 314 cm²) as an electrode of a CVD apparatus was used. The gate insulator layers 3 of a single layer were formed by changing the temperature, power and flow ratio (volume ratio) of the above gas at the time of film formation as shown in Table 1. The gas pressure of 133 Pa (constant) was used (not shown in Tables).

Next, oxide semiconductor layers (film thickness 40 nm) with compositions as described in Table 1 were formed by using sputtering targets adjusted so as to form the oxide thin films and by a sputtering method under the following conditions.

Sputtering apparatus: "CS-200" manufactured by ULVAC, Inc.
Substrate temperature: room temperature
Gas pressure: 1 mTorr
Oxygen partial pressure: 100×$O_2$/(Ar+$O_2$)=4 vol %
Film formation power density: 2.55 W/cm²

The contents of the respective metal elements in the oxide semiconductor layers obtained in this manner were analyzed by XPS (X-ray Photoelectron Spectroscopy) method. Specifically, after the area from the outermost surface to 5 nm in depth was sputtered with Ar ions, the analysis was conducted under the following conditions. As the oxide thin films to be measured by the XPS method, samples in which thin films of 40 nm having the same compositions as those described above were formed on the Si substrates were used.

X-ray source: Al Kα
X-ray output power: 350 W
Photoelectron take-off angle: 20°

After the oxide semiconductor layer 4 was thus formed as above, patterning was performed by photolithography and wet etching. The wet etchant used was "ITO-07N" manufactured by Kanto Chemical Co., Inc., which is an oxalic acid-based wet etching solution for an oxide semiconductor.

After patterning of the oxide semiconductor layer 4 as described above, a pre-annealing treatment was performed to improve the film quality of the oxide semiconductor layer. The pre-annealing treatment was performed at 350° C. in moisture vapor under atmospheric pressure for 60 minutes.

Next, an etch stopper layer 9 (film thickness 100 nm) composed of $SiO_2$ was formed to protect the surface of the oxide semiconductor layer 4. Specifically, the etch stopper layer 9 was formed by a plasma CVD method using "PD-220NL" manufactured by SAMCO Inc. In this example, the film formation was performed using a mixed gas of $N_2O$ and $SiH_4$ diluted with nitrogen as a carrier gas under the following conditions.

Film formation temperature: 230° C.
Gas pressure: 133 Pa
Film formation power density: 1.1 W/cm²
Flow ratio (volume ratio) of $SiH_4$/$N_2O$: 0.04

On the etch stopper layer 9 formed in this manner, patterning for forming an electrode was performed by photolithography and subsequently by a reactive ion etching method (RIE) to obtain contact between the oxide semiconductor layer 4 and a source-drain electrode 5.

Next, the source-drain electrode 5 was formed by a DC sputtering method using pure Mo. Specifically, in the same manner as in the case of the gate electrode described above, after a Mo thin film (film thickness 100 nm) for a source-drain electrode was formed, patterning of the source-drain electrode was carried out by photolithography.

After the source-drain electrode 5 was formed as described, a passivation layer 6 was formed to protect the oxide semiconductor layer 4. As the passivation layer 6, a layered film (total film thickness 250 nm) of $SiO_2$ (film thickness 100 nm) and SiN (film thickness 150 nm) was used. The above-mentioned $SiO_2$ and SiN were formed by a plasma CVD method using "PD-220NL" manufactured by SAMCO Inc. In this example, the $SiO_2$ film and the SiN film were successively formed. A mixed gas of $N_2O$ and $SiH_4$ was used for the formation of the $SiO_2$ film and a mixed gas of $SiH_4$, $N_2$ and $NH_3$ was used for the formation of the SiN film. In both cases, the film formation power density was set to 0.32 W/cm², and the film formation temperature was set to 150° C.

Next, a contact hole for probing for evaluating transistor characteristics was formed in the passivation layer 6 by photolithography and dry etching, thereby obtaining a TFT shown in FIG. 1.

As for each TFT obtained as described above, the stress stability was evaluated as follows.

(1) Evaluation of Stress Stability with Negative Bias Application (NBTS)

In this example, stress tests in which negative bias was applied to the gate electrode were carried out. The stress tests conditions were as follows.

Source voltage: 0 V
Drain voltage: 10 V
Gate voltage: −20 V
Substrate temperature: 60° C.
Stress tests time: 2 hours In this example, the variation value of threshold voltage in the stress tests for 2 hours was defined as a threshold voltage shift quantity ΔVth, and the pass criterion was that ΔVth<5.0 V in NBTS.

(2) Evaluation of Stress Stability with Light Irradiation and Negative Bias Application (LNBTS)

In this example, stress tests in which negative bias is continuously applied to the gate electrode were carried out while irradiating a sample with light (while light) for simulation of environments (stress) at the time of actual liquid crystal panel drive. The stress tests conditions were as follows. A while LED was used as a light source for simulation of backlight of a liquid crystal display.

Source voltage: 0 V
Drain voltage: 10 V
Gate voltage: −20 V
Substrate temperature: 60° C.
Stress tests time: 2 hours These results are all shown in Table 1. The gas flow ratio (volume ratio) in each Table is a ratio of $SiH_4$ when $N_2O$ is taken as 100.

Note that the column of "determination" was provided in the rightmost column in each Table, and the samples satisfying all of the above properties were marked with "A" and the samples not satisfying even one of those were marked with "B" in the column of "determination".

TABLE 1

| | Metal ratio of oxide semiconductor layer | | | Conditions of film formation for the gate insulator layer | | | | | Hydrogen content in gate insulator layer | LNBTS | | | NBTS | |
|---|---|---|---|---|---|---|---|---|---|---|---|---|---|---|
| | In | Zn | Sn | | Film formation power | | Gas flow ratio | | | Δ Vth | Δ Ion | SS value | Δ Vth | Deter- |
| No. | atomic % | atomic % | atomic % | Temperature (° C.) | (W) | (W/cm²) | $SiH_4$ | $N_2O$ | (atomic %) | (V) | (A) | (V/decade) | (V) | mination |
| 1 | 20 | 56.7 | 23.3 | 320 | 300 | 0.96 | 2.24 | 100 | 1.2 | 0.5 | A | 0.30 | 0.3 | A |
| 2 | 20 | 56.7 | 23.3 | 320 | 300 | 0.96 | 4 | 100 | 1.2 | 0.5 | A | 0.28 | 0.3 | A |
| 3 | 20 | 56.7 | 23.3 | 300 | 300 | 0.96 | 4 | 100 | 1.5 | 1.0 | A | 0.33 | 0.5 | A |
| 4 | 20 | 56.7 | 23.3 | 250 | 300 | 0.96 | 4 | 100 | 3.0 | 2.0 | A | 0.40 | 1.0 | A |
| 5 | 20 | 56.7 | 23.3 | 200 | 300 | 0.96 | 4 | 100 | 4.5 | 3.0 | B | 0.55 | 1.5 | B |
| 6 | 20 | 56.7 | 23.3 | 300 | 250 | 0.80 | 4 | 100 | 3.5 | 2.5 | A | 0.45 | 1.3 | A |
| 7 | 20 | 56.7 | 23.3 | 300 | 200 | 0.64 | 4 | 100 | 5.0 | 5.0 | B | 0.65 | 2.5 | B |
| 8 | 20 | 56.7 | 23.3 | 300 | 150 | 0.48 | 4 | 100 | 7.0 | 7.0 | B | 0.75 | 3.5 | B |
| 9 | 20 | 56.7 | 23.3 | 300 | 100 | 0.32 | 4 | 100 | 8.0 | 10.0 | B | 0.80 | 5.0 | B |
| 10 | 25 | 54 | 21 | 320 | 300 | 0.96 | 2.24 | 100 | 1.2 | 2.0 | A | 0.30 | 0.3 | A |
| 11 | 25 | 54 | 21 | 320 | 300 | 0.96 | 4 | 100 | 1.2 | 3.0 | A | 0.28 | 0.3 | A |
| 12 | 25 | 54 | 21 | 300 | 300 | 0.96 | 4 | 100 | 1.5 | 3.0 | A | 0.33 | 0.5 | A |
| 13 | 25 | 54 | 21 | 250 | 300 | 0.96 | 4 | 100 | 3.0 | 4.0 | A | 0.40 | 1.0 | A |
| 14 | 25 | 54 | 21 | 200 | 300 | 0.96 | 4 | 100 | 4.5 | 3.5 | B | 0.58 | 1.5 | B |
| 15 | 25 | 54 | 21 | 300 | 250 | 0.80 | 4 | 100 | 3.5 | 4.5 | A | 0.45 | 1.3 | A |
| 16 | 25 | 54 | 21 | 300 | 200 | 0.64 | 4 | 100 | 5.0 | 6.0 | B | 0.70 | 2.5 | B |
| 17 | 25 | 54 | 21 | 300 | 100 | 0.32 | 4 | 100 | 8.0 | 11.0 | B | 0.80 | 5.0 | B |
| 18 | 30 | 51.7 | 18.3 | 320 | 300 | 0.96 | 2.24 | 100 | 1.2 | 2.5 | A | 0.30 | 0.3 | A |
| 19 | 30 | 51.7 | 18.3 | 320 | 300 | 0.96 | 4 | 100 | 1.2 | 3.5 | A | 0.28 | 0.3 | A |
| 20 | 30 | 51.7 | 18.3 | 300 | 300 | 0.96 | 4 | 100 | 1.5 | 3.5 | A | 0.33 | 0.5 | A |
| 21 | 30 | 51.7 | 18.3 | 250 | 300 | 0.96 | 4 | 100 | 3.0 | 4.5 | A | 0.40 | 1.0 | A |
| 22 | 30 | 51.7 | 18.3 | 200 | 300 | 0.96 | 4 | 100 | 4.5 | 4.0 | B | 0.60 | 1.5 | B |
| 23 | 30 | 51.7 | 18.3 | 300 | 200 | 0.64 | 4 | 100 | 5.0 | 7.0 | B | 0.70 | 2.5 | B |
| 24 | 30 | 51.7 | 18.3 | 300 | 100 | 0.32 | 4 | 100 | 8.0 | 12.0 | B | 0.80 | 5.0 | B |
| 25 | 20 | 60.0 | 20.0 | 320 | 300 | 0.96 | 4 | 100 | 1.2 | 0.5 | A | 0.28 | 0.3 | A |
| 26 | 20 | 55.0 | 25.0 | 300 | 300 | 0.96 | 4 | 100 | 1.5 | 1.0 | A | 0.33 | 0.5 | A |
| 27 | 20 | 50.0 | 30.0 | 250 | 300 | 0.96 | 4 | 100 | 3.0 | 2.0 | A | 0.40 | 1.0 | A |
| 28 | 23 | 56.0 | 21.0 | 300 | 250 | 0.80 | 4 | 100 | 3.5 | 2.5 | A | 0.45 | 1.3 | A |
| 29 | 20 | 60.0 | 20.0 | 300 | 200 | 0.64 | 4 | 100 | 5.0 | 5.0 | B | 0.65 | 2.5 | B |
| 30 | 20 | 55.0 | 25.0 | 300 | 150 | 0.48 | 4 | 100 | 7.0 | 7.0 | B | 0.75 | 3.5 | B |
| 31 | 20 | 50.0 | 30.0 | 300 | 100 | 0.32 | 4 | 100 | 8.0 | 10.0 | B | 0.80 | 5.0 | B |

Light source: white LED (LED LXHL-PW01 manufactured by PHILIPS) 25000 nit

In this example, the variation value of threshold voltage in the stress tests for 2 hours was defined as a threshold voltage shift quantity ΔVth, and the pass criterion was that ΔVth<5.0 V in LNBTS.

(3) Measurement of SS Value

The SS value was defined as the minimum value of the gate voltage necessary for increasing the drain current by one digit. In this example, the SS value was measured when the stress tests (LNBTS) of the above (2) were carried out, and the pass criterion was that SS value <0.55 V/decade.

(4) Measurement of ON-Current (Ion)

The ON-current (Ion) was defined as the drain current of gate voltage of 30 V, which is the current value when the transistor is on-state. In this example, the ON-currents before and after the stress test (LNBTS) of the above (2) were measured, respectively, and the pass criterion (A) was the change quantity Mon (absolute value) between before and after the stress test of less than 10% and the reject criterion (B) was that of 10% or more.

The following can be considered from Table 1.

Table 1 shows the results which were obtained when an IZTO was used as an oxide semiconductor layer and the ratios of the respective metal elements and the film formation conditions (temperature, film formation power density, and gas flow ratio) of the gate insulator layer were changed.

As a result, as for Nos. 1 to 4, 6, 10 to 13, 15, 18 to 21, and 25 to 28 in which the temperature, the film formation power density, and the gas flow ratio ($SiH_4/N_2O$) at the time of film formation of the gate insulator layer were controlled to 250° C. or higher, 0.7 W/cm² or higher, and 0.04 or lower, respectively, the hydrogen concentration in each of the gate insulator layers was reduced to a predetermined range, and hence, the excellent properties were obtained under each of the stress tests. Furthermore, those all had the high mobility of 6 cm²/Vs or higher (the results of the mobility are not shown in Tables).

In contrast to this, the samples in the cases where any of the above conditions at the time of film formation of the gate insulator layer were not satisfied for the preferred conditions of the present invention could not have all of the desired properties (stress stability) (Nos. 5, 7 to 9, 14, 16, 17, 22 to 24, 29 to 31).

Example 2

A TFT (the gate insulator layer being composed of two layers) shown in FIG. 1 was produced as mentioned below and the stress stability and the like were evaluated. In this example, a transparent conductive film 8 in FIG. 1 was not formed.

First, a Mo thin film with a thickness of 100 nm as a gate electrode 2 was formed on a glass substrate 1 in the same manner as in Example 1.

On this the gate electrode 2, a SiN film was formed as a lower layer of the gate insulator layer 3 on the gate electrode side, and subsequently, a $SiO_2$ film was formed thereon as an upper layer of the gate insulator layer 3 on the oxide semiconductor layer side.

Both the lower and upper layers of the gate insulator layer 3 were formed using a circular electrode with a diameter of 8 inch (an area of 314 $cm^2$) as an electrode of a CVD apparatus by a plasma CVD method. Specifically, the lower layer of the gate insulator layer 3 was formed using a mixed gas of $SiH_4$, $N_2$ and $NH_3$ as a carrier gas in conditions as follows: $SiH_4/N_2$ gas flow rate: 304 sccm, $NH_3$ gas flow rate: 100 sccm, $N_2$ gas flow rate: 48 sccm, and film formation power density: 100 W (0.32 $W/cm^2$). On the other hand, the upper layer of the gate insulator layer 3 was formed using a mixed gas of $SiH_4$ and $N_2O$ as a carrier gas in conditions as follows: $SiH_4/N_2$ gas (a gas obtained by diluting $SiH_4$ gas with $N_2$ gas to 10 vol %) flow rate: 22 sccm (the flow rate of $SiH_4$ gas: 2 sccm), $N_2O$ gas flow rate: 100 sccm, and the film formation power density: 300 W (0.96 $W/cm^2$). At the time of film formation of both the lower and upper layers, the temperature was set to 320° C. (constant) and the gas pressure was set to 200 Pa (constant). The hydrogen content and film thickness in the formed gate insulator layer are shown in Table 2.

Next, on the upper layer in the gate insulator layer 3, an oxide semiconductor layer (film thickness 40 nm) with compositions as described in Table 2 was formed by using a sputtering target adjusted so as to form the oxide thin film by a sputtering method under the following conditions.

Sputtering apparatus: "CS-200" manufactured by ULVAC, Inc.
Substrate temperature: room temperature
Gas pressure: 1 mTorr
Oxygen partial pressure: $100 \times O_2/(Ar+O_2)$=4 vol %
Film formation power density: 2.55 $W/cm^2$ After the oxide semiconductor layer 4 was thus formed as above, patterning was performed by photolithography and wet etching in the same manner as in Example 1, and subsequently, a pre-annealing treatment was performed to improve the film quality of the oxide semiconductor layer.

Next, in the same manner as in Example 1, an etch stopper layer 9 (film thickness 100 nm) composed of $SiO_2$ was formed to protect the surface of the oxide semiconductor layer 4. Subsequently, to the etch stopper layer 9 formed, photolithography was performed and then patterning for forming an electrode was performed by a reactive ion etching method (RIE) to obtain contact between the oxide semiconductor layer 4 and a source-drain electrode 5.

Next, in the same manner as in Example 1, the source-drain electrode 5 was formed by a DC sputtering method using pure Mo, and then a passivation layer 6 was formed to protect the oxide semiconductor layer 4.

Next, in the same manner as in Example 1, a contact hole for probing for evaluating transistor characteristics was formed in the passivation layer 6 by photolithography and dry etching, thereby obtaining a TFT shown in FIG. 1.

As for each of the TFTs obtained as described above, the stress stability was evaluated in the same manner as in Example 1.

TABLE 2

| | Metal ratio of oxide semiconductor layer | | | Gate insulator layer on oxide semiconductor layer side (upper layer) | | Gate insulator layer on gate electrode side (lower layer) | | LNBTS | | | NBTS | |
|---|---|---|---|---|---|---|---|---|---|---|---|---|
| No. | In atomic % | Zn atomic % | Sn atomic % | Hydrogen content in gate insulator layer (atomic %) | Film thickness (nm) | Hydrogen content in gate insulator layer (atomic %) | Film thickness (nm) | Δ Vth (V) | Δ Ion (A) | SS value (V/decade) | Δ Vth (V) | Determination |
| 1 | 20 | 56.7 | 23.3 | 1.2 | 50 | 28 | 200 | 2.5 | A | 0.32 | 1.5 | A |
| 2 | 20 | 56.7 | 23.3 | 1.2 | 10 | 28 | 240 | 3.5 | A | 0.32 | 2.0 | A |

The following can be considered from Table 2.

Table 2 shows the results which were obtained when the gate insulator layer 3 was formed in two layers of the SiN film layer and the $SiO_2$ film layer and the ratio of the two layers was changed.

Generally, the $SiO_2$ film is a compact film and manifests excellent characteristics, but the film-forming speed is low and the productivity tends to be deteriorated. On the other hand, the SiN film has a poor compactness but has the property of a high film-forming speed. According to Table 2, it can be confirmed that even though a thickness of the SiN film with respect to the $SiO_2$ film is increased to a ratio of $SiO_2$ film:SiN film=1:24 (No. 2), excellent characteristics can be obtained under the stress tests.

EXPLANATION OF REFERENCE NUMERALS

1 Substrate
2 Gate electrode
3 Gate insulator layer
4 Oxide semiconductor layer
5 Source-drain electrode 6 Passivation layer (insulator layer)
7 Contact hole
8 Transparent conductive film
9 Etch stopper layer

The invention claimed is:

1. A thin film transistor, comprising:
   a gate electrode;
   an oxide semiconductor layer comprising a single layer as a channel layer;
   an etch stopper layer that protects a surface of the oxide semiconductor layer;
   a source-drain electrode; and
   a gate insulator layer arranged between the gate electrode and the channel layer,
   wherein the oxide semiconductor layer comprises In, Zn and Sn,
   wherein a hydrogen concentration in the gate insulator layer in direct contact with the oxide semiconductor layer is from 0.667 to 4 atomic %,
   wherein the gate insulating layer in direct contact with the oxide semiconductor layer is a silicon oxide film, and
   wherein the gate insulator layer comprises the single layer structure.

2. The thin film transistor according to claim 1, wherein when contents (atomic %) of the respective metal elements with respect to all of metal elements excluding oxygen contained in the oxide semiconductor layer are defined as [In], [Zn] and [Sn], respectively, a relationship of $$15 \leq [In] \leq 35, 50 \leq [Zn] \leq 60 \text{ and } 15 \leq [Sn] \leq 30$$

is satisfied.

3. A display device comprising the thin film transistor according to claim 1.

4. A display device comprising the thin film transistor according to claim 2.

5. The thin film transistor according to claim 1, wherein the oxide semiconductor layer comprises from 15 to 20 atomic % of In.

6. The thin film transistor according to claim 1, wherein the oxide semiconductor layer comprises from 20 to 30 atomic % of Sn.

* * * * *